United States Patent [19]
Mase et al.

[11] Patent Number: 6,015,754
[45] Date of Patent: Jan. 18, 2000

[54] CHEMICAL MECHANICAL POLISHING APPARATUS AND METHOD

[75] Inventors: Yasukazu Mase; Yoshitaka Matsui, both of Yokohama; Takeshi Kubota, Ichikawa; Toshihiko Kitamura, Kawasaki, all of Japan

[73] Assignee: Kabushiki Kaisha Toshiba, Kawasaki, Japan

[21] Appl. No.: 08/996,695

[22] Filed: Dec. 23, 1997

[30] Foreign Application Priority Data

Dec. 25, 1996 [JP] Japan ................................. 8-344733

[51] Int. Cl.[7] ............................. H01L 21/302; C23F 1/02
[52] U.S. Cl. ......................... 438/692; 156/345; 216/86; 216/89; 438/17; 438/18
[58] Field of Search .............................. 156/345; 216/89, 216/86; 438/692, 17, 18

[56] References Cited

U.S. PATENT DOCUMENTS

| | | | |
|---|---|---|---|
| 5,081,421 | 1/1992 | Miller et al. | 156/627 |
| 5,321,304 | 6/1994 | Rostoker | 257/621 |
| 5,337,015 | 8/1994 | Lustig | 156/627 |
| 5,562,529 | 10/1996 | Kishii et al. | 451/36 |

FOREIGN PATENT DOCUMENTS 61-008943  1/1986  Japan.

*Primary Examiner*—Benjamin Utech
*Assistant Examiner*—George Goudreau
*Attorney, Agent, or Firm*—Finnegan, Henderson, Farabow, Garrett & Dunner, L.L.P.

[57] ABSTRACT

A CMP apparatus is used to subject a target surface of a semiconductor wafer to a polishing treatment, by moving the target surface and a polishing surface of a polishing cloth relative to each other while supplying a polishing liquid between the target surface and the polishing surface. Electric resistance is measured between pairs of measuring points arranged on opposite sides of dicing lines on the target surface, while subjecting the target surface to the polishing treatment. The polishing treatment is caused to be ended by comparing detected values of a changing rate in measured values of the electric property with a reference value set to correspond to an end point of the polishing treatment.

20 Claims, 6 Drawing Sheets

CHEMICAL MECHANICAL POLISHING APPARATUS AND METHOD

BACKGROUND OF THE INVENTION

The present invention relates to a method and apparatus for planarizing a target object by means of CMP, i.e., Chemical Mechanical Polishing, especially in the field of semiconductor process. The semiconductor process includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

With an increase in the speed and integration level of semiconductor devices, planarization techniques for semiconductor wafers have become some of the most important techniques. This is because the accuracy of the planarization techniques has a great effect on the characteristics of semiconductor devices. For example, the planarization techniques need to have a high accuracy to ensure a designed depth of focus for lithography steps.

Among the planarization techniques, the CMP has attracted attention in recent years, in place of conventional techniques, such as etching-back of SOG (Spin On Glass), re-flowing of BPSG (Boron Phospho Silicate Glass) by a TEOS (tetraethyl orthosilicate)/$O_3$ based gas. The CMP can present an excellent process accuracy in planarization of a wafer both locally and globally. Target objects to be planarized by the CMP include conductive and non-conductive layers.

FIGS. 8A to 8D are cross-sectional views showing steps in the order of a process of forming a wiring structure by means of a conventional CMP method. In these drawings, there are shown a semiconductor wafer 81, a plasma SiOx layer 82, a photoresist layer 83, wiring grooves 84, a barrier metal layer 85, and an Al alloy layer 86.

First, the plasma SiOx layer 82 having a thickness of 1.0 $\mu$m is formed on the semiconductor wafer 81 by means of plasma CVD. Then, the photoresist layer 83 patterned by means of lithography is formed on the SiOx layer 82 (FIG. 8A).

The SiOx layer 82 is etched to form wiring grooves 84 therein, while the photoresist layer 83 is used as a mask. The photoresist layer 83 is then removed by means of $O_2$-plasma ashing (FIG. 8B).

To cover the inner surface of the wiring grooves 84, the barrier metal layer 85 consisting of TiN/Ti and having a thickness of 0.1 $\mu$m is formed by means of sputtering. Then, the Al alloy layer 86 having a thickness of 1.0 $\mu$m is formed on the barrier metal layer 85 to fill the wiring grooves 84, by means of high-temperature sputtering (FIG. 8C). At this time, the temperature of the sputtering is set at 450° C.

That part of the Al alloy layer 86 outside the wiring grooves 84 is removed by a polishing treatment using a CMP method. As a result, a wiring structure formed of the wiring grooves 84 buried by the Al alloy layer 86 is completed (FIG. 8D). In the polishing treatment, its end point is determined as follows.

First, a polishing period of time is obtained to exactly correspond to a calculated value on the basis of a CMP rate derived from a test sample and the thickness of the Al alloy layer 86. Then, a process margin, such as 30% of the calculated period, is added thereto and the sum is set as an actual CMP period of time. The process margin is added in light of fluctuation in the process conditions, such as the thickness and shape of a target layer, and the like; mechanical fluctuation in the apparatus conditions, such as the surface condition of a polishing cloth, the pressure and relative speed between a polishing cloth and a target surface, the size of polishing powder particles, and the like; and chemical fluctuation in the apparatus conditions, such as the uniformity, volume and temperature of a polishing agent, and the like. In other words, the Al alloy layer 86 is over-polished not to allow a residue of the layer 86, i.e., the wiring material, to be left on the plasma SiOx layer 82, i.e., the insulating film, due to unevenness in the depth of the wiring grooves 84, the thickness of the Al alloy layer 86, the CMP rate, and the like.

However, there is a case where the process behavior itself is shifted toward an over-polishing, due to an independent effect or a synergetic effect of unevenness in the depth of the wiring grooves 84, the thickness of the Al alloy layer 86, the CMP rate, and the like. In this case, the above described method, which utilizes time administration, causes a dishing phenomenon in which the embedded material in the wiring grooves 84 becomes abnormally thin.

FIG. 9 is a view showing a dishing state after the Al alloy layer is polished by a conventional CMP method. The dishing degree Da may reach 20% to 35% of the depth Db of the wiring grooves 84 forming a buried pattern, due to a synergetic effect of unevenness in the above described factors. Where the thickness of wiring becomes unstably thinner than a designed value, problems arise in devices to be manufactured, such that their performance is degraded and their yield decreases, due to an increase in the wiring resistance, and an unevenness of the wiring resistance on the surface of one wafer or among wafers, and that their lifetime becomes short due to electro-migration. Generally, the dishing degree becomes higher as an area to be treated grows wider.

As a countermeasure against the dishing phenomenon, a hard polishing pad has been tested, but found to entail the following disadvantages. Specifically, a target surface to be treated by means of CMP has no ideal flatness as shown in FIG. 10A, but is waved as shown in FIG. 10B due to effects of a process and malflatness of a wafer. For this reason, it is preferable for the polishing surface of a polishing pad to extend along line La—La in FIG. 10B. However, the polishing surface of a hard polishing pad tends to be almost flat along line Lb—Lb in FIG. 10B. As a result, the thickness of polished wiring layers becomes uneven in the surface of a wafer, thereby lowering reliability of the wiring.

To reiterate, wiring decreases its reliability in either case of using a hard pad or a soft pad, because the polishing surface of the hard pad hardly follows the target surface, while the soft pad entails an increase in the dishing degree. In order to solve this problem, there has been proposed a polishing pad having a two-layer structure in which a hard pad is stacked on the surface of a soft resin. Although this structure is intended to solve the problem of a trade-off type by balancing the two members, disadvantages of the two members emerge to some extent in this structure, thereby resulting in a limit in solving the problem.

There has also been proposed a method of monitoring polished states in real time to detect an end point. However, since hardly any stable and effective method of detecting a CMP end point can be realized, it is inevitable to practically adopt the aforementioned method utilizing time administration.

BRIEF SUMMARY OF THE INVENTION

The present invention was made in light of the above described problems, and its object is to provide a CMP apparatus and method which can suppress the dishing phenomenon on a target object.

According to a first aspect of the present invention, there is provided a chemical mechanical polishing apparatus comprising:

a polishing mechanism for subjecting a target surface of a target object to a polishing treatment, by moving the target surface and a polishing surface of a polishing member relative to each other while supplying a polishing liquid between the target surface and the polishing surface;

a measuring mechanism for measuring an electric property comprising electric resistance or a property representing the resistance between a pair of measuring points on the target surface, while subjecting the target surface to the polishing treatment; and a controller for causing the polishing treatment to be ended by comparing detected values derived from measured values of the electric property with a reference value set to correspond to an end point of the polishing treatment.

According to a second aspect of the present invention, there is provided a chemical mechanical polishing method comprising the steps of:

subjecting a target surface of a target object to a polishing treatment, by moving the target surface and a polishing surface of a polishing member relative to each other while supplying a polishing liquid between the target surface and the polishing surface;

measuring an electric property comprising electric resistance or a property representing the resistance between a pair of measuring points on the target surface, while subjecting the target surface to the polishing treatment; and causing the polishing treatment to be ended by comparing detected values derived from measured values of the electric property with a reference value set to correspond to an end point of the polishing treatment.

the reference value and the detected values may comprise values of the electric resistance, or values of a changing rate in the electric resistance.

Preferably, the pair of measuring points are arranged on opposite sides of the target surface, and are rotated integratedly with the target object during the polishing treatment.

Where the target object comprises a semiconductor wafer and the target surface is defined by a conductive layer, the pair of measuring points are preferably arranged on opposite ends of a dicing line extending across the wafer for cutting away a plurality of semiconductor devices to be formed on the wafer, from each other. Another pair of measuring points may be arranged on opposite ends of a dicing line extending perpendicular to the aforementioned dicing line.

Where the target surface is defined by a non-conductive layer, the electric property comprises electric resistance or a property representing the resistance of a liquid layer, which is formed of the polishing liquid between the target surface and the polishing surface.

In a more specific and preferable manner, a pair of measuring electrodes are arranged on a holder for holding a semiconductor wafer. When a polishing treatment is performed by means of CMP, the electric resistance of a conductive layer on the wafer or a thin liquid layer between the wafer and a polishing cloth is monitored by the pair of measuring electrodes. An end point of the polishing treatment is determined by a controller on the basis of a change in the monitored electric resistance. With this arrangement in CMP, it is possible to realize a method of detecting an end point, which properly and reliably ensures a polishing amount, and to perform the polishing while following mechanical and chemical fluctuation in process and apparatus conditions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
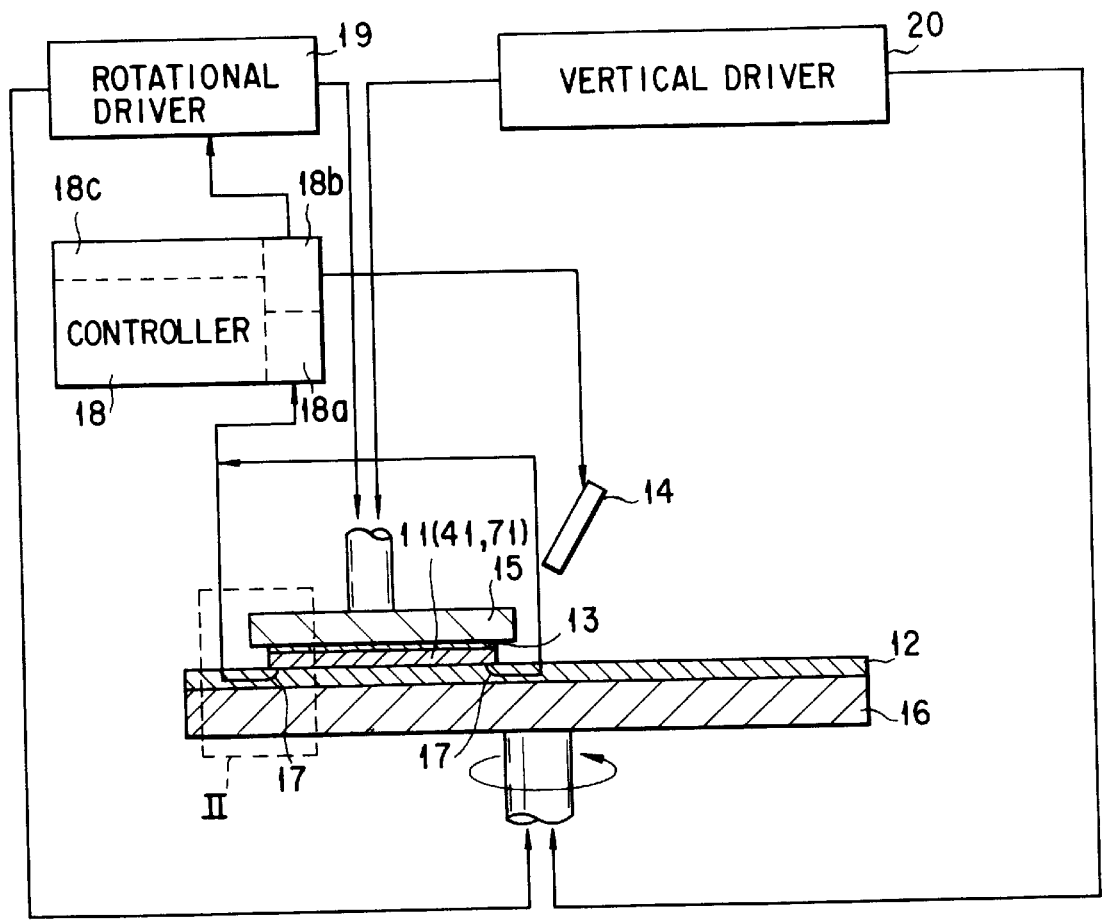
FIG. 1 is a view showing the main constitution of a CMP apparatus according to an embodiment of the present invention.
Figure 2A:
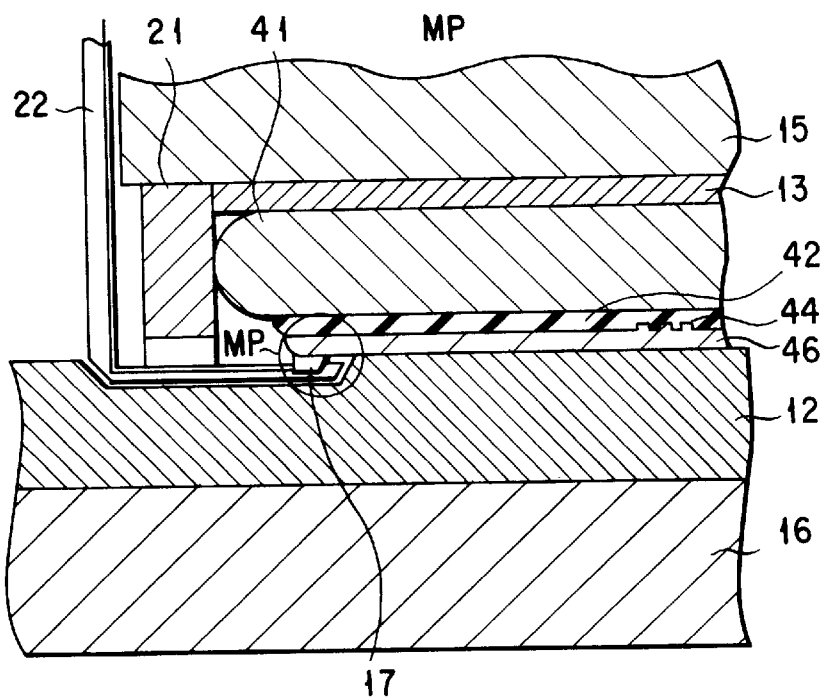
FIGS. 2A and 2B are enlarged views showing a portion II in FIG. 1 in cases of polishing a conductive layer and a non-conductive layer, respectively.
Figure 2B:
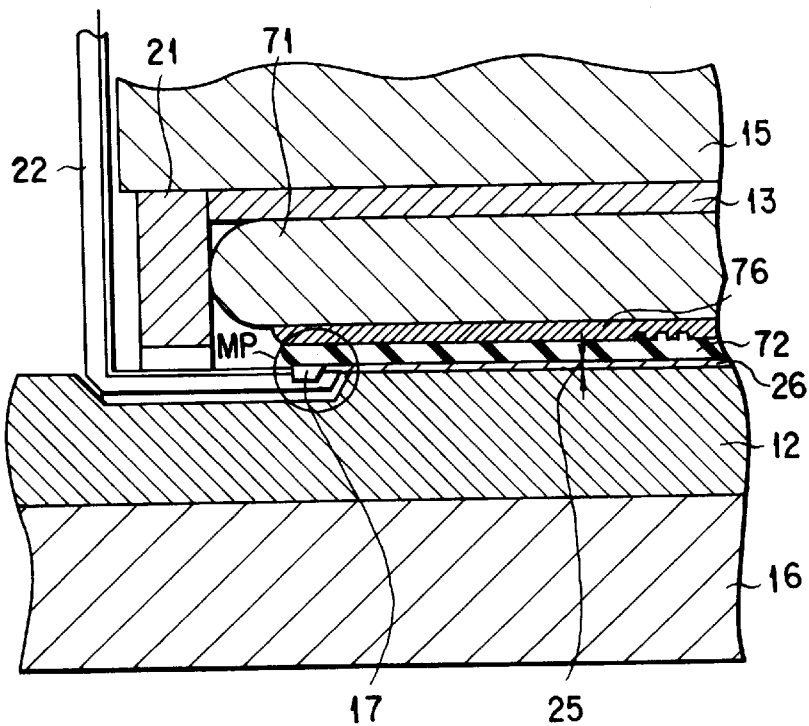

FIG. 1 is a view showing the main constitution of a CMP apparatus according to an embodiment of the present invention. The CMP apparatus has upper and lower circular plates 15 and 16 having small and large diameters, respectively, and facing each other. On the upper circular plate 15 is a holder 13 for holding a semiconductor wafer 11 (41, 71). The holder 13 has a support ring 21 surrounding the periphery of the wafer 11 in a closely fitted state (FIGS. 2A and 2B). On the lower circular plate 16 is a polishing cloth 12 defining a polishing surface for subjecting the target surface of the wafer 11 to a polishing treatment. The upper and lower circular plates 15 and 16 are respectively driven by a rotational driver 19 and moved closer to and away from each other in a vertical direction by a vertical driver 20.

A polishing liquid supply pipe 14 is arranged to supply a polishing liquid between the target surface of the wafer 11 and the polishing surface of the polishing cloth 12. The polishing liquid contains a polishing powder which contributes to the physical polishing action, and a polishing agent which contributes to the chemical polishing action. Accordingly, in the CMP apparatus, the target surface of the wafer 11 and the polishing surface of the polishing cloth 12 are moved relative to each other while the polishing liquid is supplied between the target surface and the polishing surface, to subject the target surface to a polishing treatment.

At least one pair, but preferably pairs, of measuring electrodes 17 are supported by the upper circular plate 15 such that they are rotated integratedly with the wafer 11 fixed on the holder 13. The measuring electrodes 17 are mounted on the distal ends of the angle supports 22 (FIGS. 2A and 2B) and face surface portions on opposite ends of the target surface. The angle supports 22 are supported by the upper circular plate 15 to be movable up and down along grooves formed in the support ring 21 of the holder 13. With this arrangement, the measuring electrodes 17 are prevented from interfering with the wafer W being attached to and detached from the holder 13, and are further capable of facing the target surface of the wafer 11 selectively in contact therewith or with a small gap therebetween.

The measuring electrodes 17 are connected to a measuring circuit 18a contained in a controller 18. The measuring circuit 18 measures an electric property formed of electric resistance or a property representing the resistance between the pairs of measuring points on the target surface corresponding to the pairs of measuring electrodes 17, while the target surface of the wafer 11 is subjected to a polishing treatment. In the controller 18, a comparing circuit 18b is contained for comparing detected values derived from measured values of the electric property with a reference value set to correspond to an end point of the polishing treatment. The reference value is predetermined on the basis of, for example, experimental data, and inputted in the controller 18 through an in/out section 18c. When the comparing circuit 18b concludes that a detected value has reached the reference value, the controller 18 outputs a signal for ending the polishing treatment to the rotational driver 19 and the polishing liquid supply section, at this time, or at a timing in which some optimum period of time experientially obtained is added thereto. As a result, the upper and lower circular plate 15 and 16 stop being rotated, and the polishing liquid stops being supplied from the supply pipe 14.

FIGS. 4A to 4D are cross-sectional views showing steps in the order of a process of forming a wiring structure by means of a CMP method according to an embodiment of the present invention. In these drawings, there are shown a semiconductor wafer 41, a plasma SiOx layer 42, a photoresist layer 43, wiring grooves (buried pattern) 44, a barrier metal layer 45, and an Al alloy layer 46.

Figure 4A:
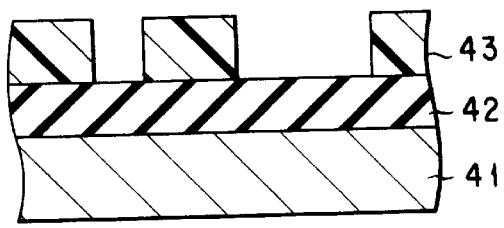
FIGS. 4A to 4D are cross-sectional views showing steps in the order of a process of forming a wiring structure by means of a CMP method according to an embodiment of the present invention.

First, the plasma SiOx layer 42 having a thickness of 1.0 $\mu$m is formed on the semiconductor wafer 41 by means of plasma CVD. Then, the photoresist layer 43 patterned by means of lithography is formed on the SiOx layer 42 (FIG. 4A).

Figure 4B:
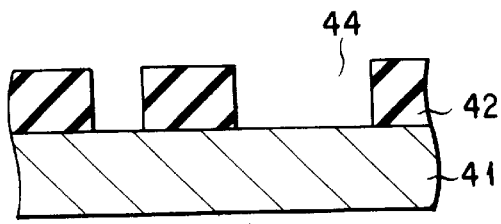

The SiOx layer 42 is etched to form wiring grooves 44 therein, while the photoresist layer 43 is used as a mask. The photoresist layer 43 is then removed by means of $O_2$-plasma ashing (FIG. 4B).

Figure 4C:
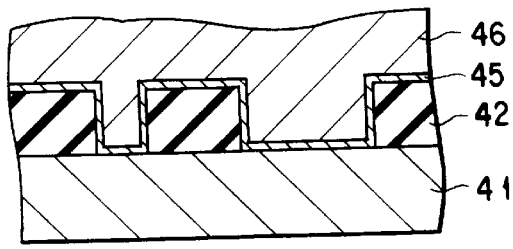

To cover the inner surface of the wiring grooves 44, the barrier metal layer 45 consisting of TiN/Ti and having a thickness of 0.1 $\mu$m is formed by means of sputtering. Then, the Al alloy layer 46 having a thickness of 1.0 $\mu$m is formed on the barrier metal layer 45 to fill the wiring grooves 44, by means of high-temperature sputtering (FIG. 4C). At this time, the temperature of the sputtering is set at 450° C.

Figure 4D:
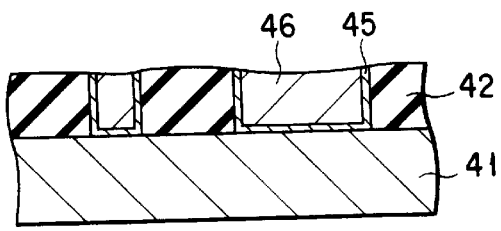

That part of the Al alloy layer 46 outside the wiring grooves 44 is removed by a polishing treatment using a CMP method. As a result, a wiring structure formed of the wiring grooves 44 buried by the Al alloy layer 46 is completed (FIG. 4D). At this time, grooves corresponding to dicing lines, which extend across the wafer for cutting away a plurality of semiconductor devices from each other, are also buried by the Al alloy layer 46, along with the wiring grooves 44. The polishing treatment is performed in the CMP apparatus shown in FIG. 1.

More specifically, the wafer 41 (or wafer 11 in FIG. 1) which has undergone the step shown in FIG. 4C is vacuum-fixed on the holder 13 by its back side such that the surface of the Al alloy layer 46 (main embedded material) is positioned to face the surface of the polishing cloth 12. Then, the target surface of the wafer 11 is pressed against the polishing surface of the polishing cloth 12 and is polished, while the upper and lower circular plate 15 and 16 are rotated and the polishing liquid is supplied onto the polishing cloth 12 from the supply pipe 14.

Polishing conditions at this time may be as follows: The polishing liquid is set at a concentration of 5% and pH 9.0, and is supplied at a flow rate of 100 ml/min. The upper and lower circular plates 15 and 16 are set at rotational speeds of 100 rpm and 200 rpm, respectively, with a pressure of 300 $g/cm^2$ therebetween.

During the polishing treatment, the pairs of measuring electrodes 17 are rotated integratedly with the wafer 41 while they are in contact with the target surface of the Al alloy layer 46. The electric resistance between each pair of measuring electrodes 17 is monitored by the controller 18, and an end point of the polishing treatment is determined on the basis of a change in the electric resistance. A unit of information on the end point is sent from the controller 18 to the rotational driver 19, so that the upper and lower circular plates 15 and 16 stop being rotated, thereby ending the polishing treatment.

A detailed explanation will be given on a method of determining the end point according to the present invention. FIG. 2A is enlarged views showing a portion II in FIG. 1 in a case of performing the step shown in FIG. 4D.

In FIG. 2A, the wafer 41 is vacuum-fixed on the holder 13 by its back side, with its circumferential surface being guided by the support ring 14. While the target surface of the Al alloy layer 46 is polished in this state, the electric resistance between each of the pairs of measuring electrodes 17, which are in contact with the target surface, is monitored (see circle MP in FIG. 2A).

Figure 5:
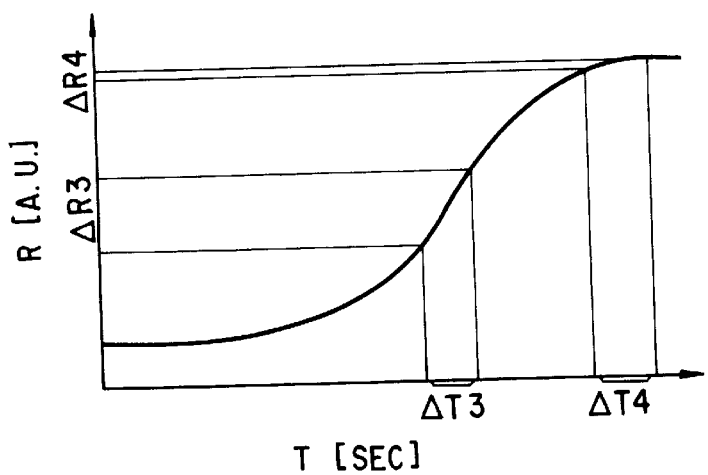
FIG. 5 is a graph showing a relationship between a polishing period of time and a mean value of electric resistance measured by measuring electrodes, in the CMP method according to the embodiment.

FIG. 5 is a graph showing a relationship between a polishing period of time and a mean value of electric resistance measured by the measuring electrodes 17, during the polishing treatment.

With progress of the polishing treatment, the Al alloy layer 46, which is a conductive layer, gradually grows thinner, and finally is left only in the wiring grooves 44 and the grooves corresponding to the dicing lines. Accordingly, change per unit period of time T, i.e., changing rate, in the electric resistance between the pairs of measuring electrodes 17, is large in the middle of the polishing treatment, and then quickly decreases from a time when the wiring grooves 44 are exposed, near the end point of the polishing treatment.

More specifically, in FIG. 5, $\Delta R4/\Delta T4$ obtained near the end point of the polishing treatment is far smaller than $\Delta R3/\Delta T3$ obtained in the middle of the polishing treatment. $\Delta R4$ and $\Delta T4$ denote a minute period of time and a change in the electric resistance corresponding thereto, respectively, near the end point of the polishing treatment, while $\Delta R3$ and $\Delta T3$ denote a minute period of time and a change in the electric resistance corresponding thereto, respectively, in the middle of the polishing treatment.

Accordingly, at first, a changing curve line of the electric resistance as shown in FIG. 5 is obtained by experiments in advance, and a reference value of $\Delta R/\Delta T$ corresponding to an end point of the polishing treatment is determined and is inputted in the controller 18. A signal for ending the polishing treatment is outputted from the controller 18 on the basis of the comparison of actually detected values of $\Delta R/\Delta T$ with the reference value. The output of the end signal can be done at an arbitrary timing, such as at a timing when a detected value reaches the reference value, or at a timing in which some optimum period of time experientially obtained is added thereto.

Where the pairs of measuring electrodes 17 are arranged in accordance with some of the grooves corresponding to the dicing lines, electric resistance corresponding to an end point of the polishing treatment presents a substantially constant value. This is because, the grooves of the dicing lines extend across the wafer to cut out and separate semiconductor devices from each other. When the grooves are exposed, the electric resistance value between the pairs of measuring electrodes 17 are decided substantially by the conductive layer embedded in the grooves of the dicing lines. In this case, the reference and detected values need not be changing rates in an electric property formed of the electric resistance or a property representing the resistance, but may be values of the electric property itself.

Figure 3A:
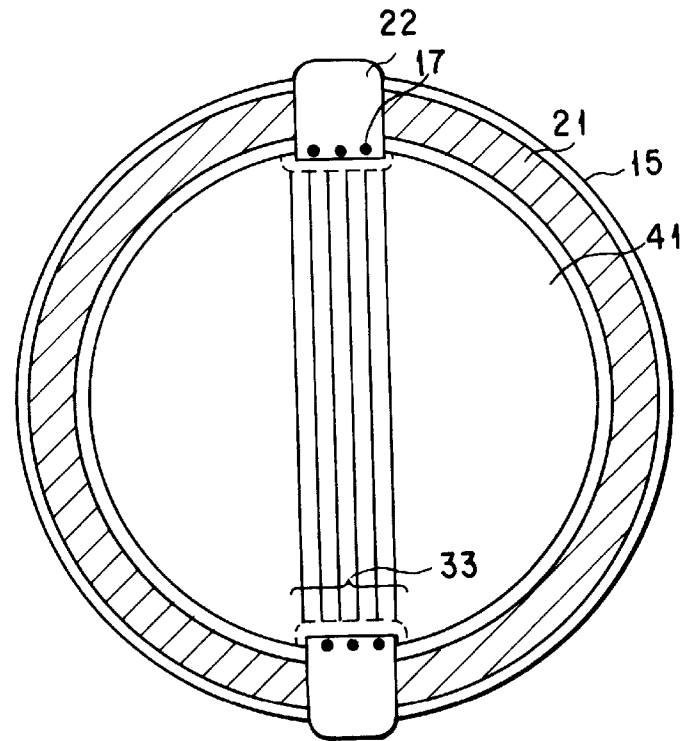
FIGS. 3A and 3B are a bottom view showing a case where measuring electrodes are arranged along dicing lines, in the apparatus shown in FIG. 1, and a bottom view showing a modification thereof, respectively.
Figure 3B:
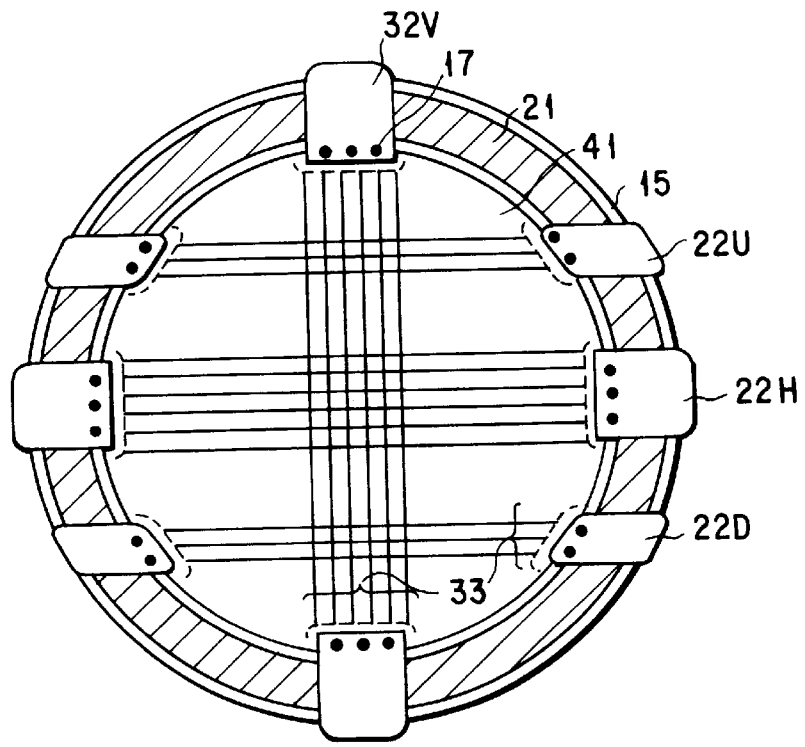

FIGS. 3A and 3B are a bottom view showing a case where the measuring electrodes 17 are arranged along some of the dicing lines 33, in the apparatus shown in FIG. 1, and a bottom view showing a modification thereof, respectively.

In FIG. 3A, a pair of angle supports 22 are arranged such that their distal ends are positioned, one on either end of a set of dicing lines 33 extending in the vertical direction of FIG. 3A. The distal end of each angle support 22 is provided with three measuring electrodes 17, so that three pairs of measuring points are totally disposed. With this arrangement, it is possible to measure electric resistance changes and take the average thereof in a diameter direction of the wafer 41.

In FIG. 3B, three pairs of angle supports 22H, 22U, and 22D are respectively arranged such that their distal ends are positioned, one on either end of three sets of dicing lines 33 extending in the horizontal direction of FIG. 3B, while a pair of angle supports 22V are arranged such that their distal ends are positioned, one on either end of a set of dicing lines 33 extending in the vertical direction of FIG. 3B. The distal end of each of the angle supports 22V and 22H is provided with three measuring electrodes 17, while the distal end of each of the angle supports 22U and 22D is provided with two measuring electrodes 17, so that ten pairs of measuring points are totally disposed.

With the arrangement shown in FIG. 3B, it is possible to measure electric resistance changes and take the average thereof in diameter directions of the wafer 41 perpendicular to each other, so that an averaged resistance value over almost all the target surface can be obtained. Further, inclination of the polishing cloth surface relative to the target surface can be monitored, and can be adjusted, if necessary, on the basis of the difference in the electric resistance between the measuring electrodes 17 on the supports 22U and the measuring electrodes 17 on the supports 22D.

Where a pair of measuring electrodes is arranged along at least one of the continuous dicing lines, as FIGS. 3A and 3B, the change in electric resistance shown in FIG. 5 is saturated near the end point of the polishing treatment, thereby increasing detection sensitivity. This is due, as described above, to metal left in the grooves of the dicing lines, near the end points of the polishing treatment. Note that, although the pairs of measuring electrodes 17 are arranged on the opposite ends of some of the dicing lines in FIGS. 3A and 3B, one or both of the electrodes in each pair may be arranged at an arbitrary position separated from the periphery of the target surface.

Figure 6:
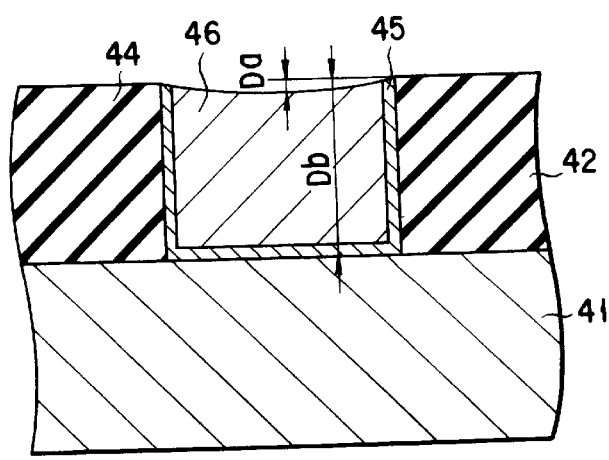
FIG. 6 is a schematic view showing a dishing state after an Al alloy layer is polished by means of the CMP method according to the embodiment.
Figure 9:
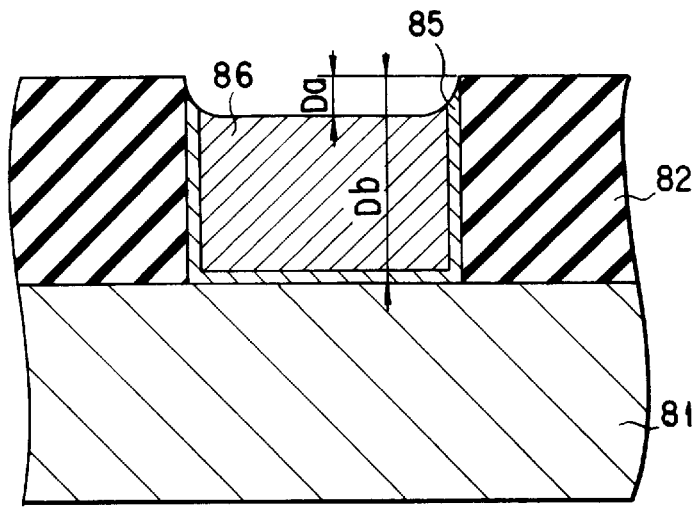
FIG. 9 is a schematic view showing a dishing state after an Al alloy layer is polished by means of the conventional CMP method.
Figure 10A:
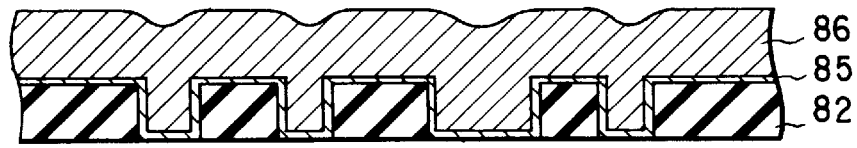
FIGS. 10A and 10B are cross-sectional views each showing a state of a target surface to be treated by means of CMP.
Figure 10B:
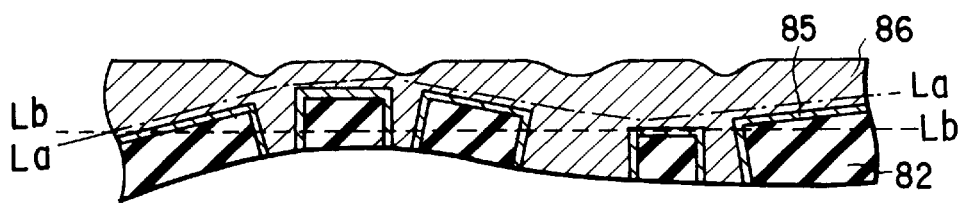

As described above, with the CMP method of polishing a conductive layer according to the present invention, a polishing treatment can be performed while following process fluctuation in, for example, stepped portions and thickness, and mechanical and chemical fluctuation of an apparatus. As a result, it is possible to realize end-point detection, which ensures an over-CMP amount in a proper and stable state. FIG. 6 is a schematic view showing a dishing state after the Al alloy layer 46 is polished by means of the CMP method according to the present invention. In experiments, the ratio of the dishing degree Da to the depth Db of the wiring grooves 44, i.e., Da/Db was about 0.06, and, at least, not more than 0.1. This value of the dishing degree is about one-third to a half of that obtained by the conventional method shown in FIG. 9. Namely, reliability of the wiring is improved to a great extent in the present invention.

As has been described with reference to FIG. 2A, the above explanation relates to a case where a target to be polished is a conductive layer, such as a layer of Al, TiN, Ti, Cu, Au, or W. The present invention, however, can be applied to a case where a target to be polished is a non-conductive layer, such as a layer of insulating material, e.g., SiOx (SiO$_2$) or SiNx, a layer of poly-crystal, e.g., poly-Si, or a layer of amorphous material, e.g., a-Si.

FIG. 2B is enlarged views showing a portion II in FIG. 1 in a case of polishing a non-conductive layer. In FIG. 2A, the wafer 71 is vacuum-fixed on the holder 13 by its back side, with its circumferential surface being guided by the support ring 14. On a wafer 71, a plasma SiOx layer 72 is formed overall to cover and protect a device structure including an Al alloy layer 76 and the like. The SiOx layer 72 is polished and planarized from its top by the apparatus shown in FIG. 1.

In this case, a small gap 25 is formed between the target surface of the SiOs layer 72 and the polishing surface of the polishing cloth 12, so that a thin liquid layer 26 of a polishing liquid is formed. Each pair of measuring electrodes 17 are arranged to measure electric resistance of the liquid layer 26 or a property representing the resistance (see circle MP in FIG. 2B). With this arrangement, it is possible to measure a change in the electric resistance due to a change in the ratio between the amount of electrolyte substances and the amount of insulating substances which have been scraped off by polishing, thereby determining an end point of the polishing treatment. The thickness of the gap 25 can be adjusted by the vertical driver 20 shown in FIG. 1.

FIGS. 7A to 7D are cross-sectional views showing steps in the order of a process of forming a protection structure by means of a CMP method according to another embodiment of the present invention. In these drawings, there are shown a semiconductor wafer 71, a plasma SiOx layer 72, a photoresist layer 73, and an Al alloy layer 76.

Figure 7A:
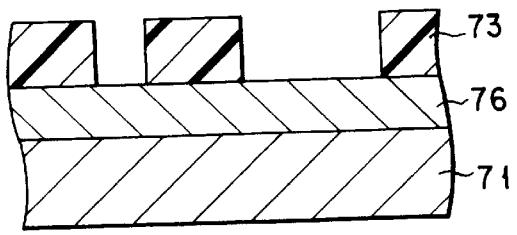
FIGS. 7A to 7D are cross-sectional views showing steps in the order of a process of forming a protection structure by means of a CMP method according to another embodiment of the present invention.

First, the Al alloy layer 76 having a thickness of 1.0 $\mu$m is formed on the semiconductor wafer 71 by means of sputtering. Then, the photoresist layer 73 patterned by means of lithography is formed on the Al alloy layer 76 (FIG. 7A).

Figure 7B:
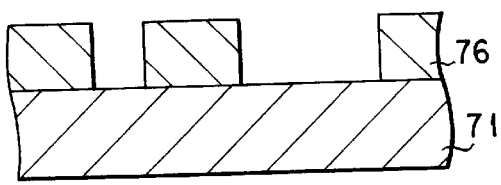

The Al alloy layer 76 72 is etched to form a pattern thereof, while the photoresist layer 73 is used as a mask. The photoresist layer 73 is then removed by means of $O_2$-plasma ashing (FIG. 7B).

Figure 7C:
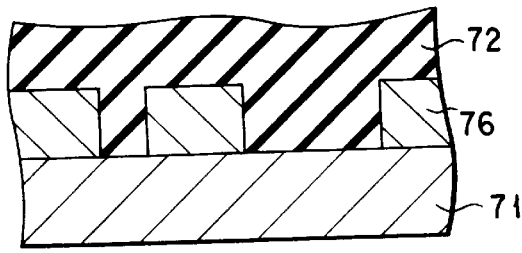

To cover the Al alloy layer 76 and the like, the plasma SiOx layer 72 having a large thickness is formed all over the semiconductor wafer 71 by means of plasma CVD (FIG. 7C). Then, the SiOx layer 72 is polished and planarized from its top by a polishing treatment using a CMP method. As a result, a structure covered with the insulating protection layer 72 having a flat top surface is completed (FIG. 7D).

Figure 7D:
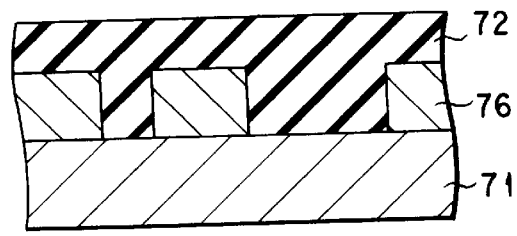
Figure 8A:
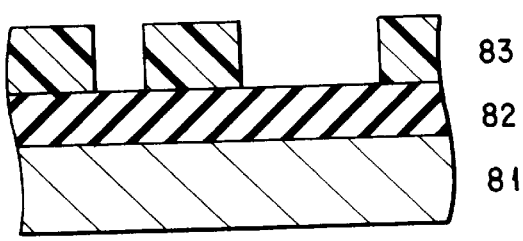
FIGS. 8A to 8D are cross-sectional views showing steps in the order of a process of forming a wiring structure by means of a conventional CMP method.
Figure 8B:
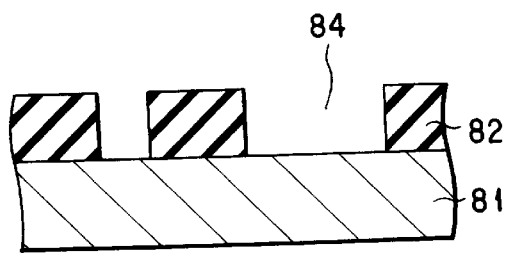
Figure 8C:
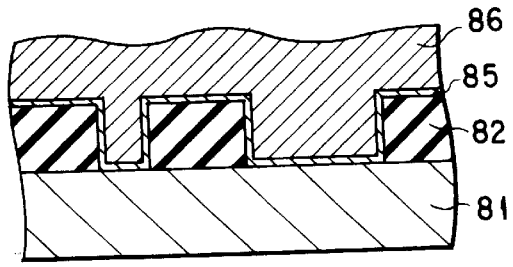
Figure 8D:
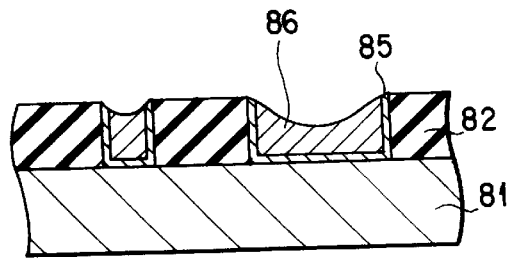

In the polishing treatment of the SiOx layer 72, the ratio V2/V1 in the polishing liquid, which is present in the gap 25 shown in FIG. 2B, decreases from the step of FIG. 7C to the step of FIG. 7D, where V1 and V2 denote the amount of electrolyte substances and the amount of insulating substances which have been scraped off by polishing, respectively. Accordingly, in contrast to the case shown in FIG. 5, the electric resistance measured by the measuring electrodes 17 decreases with progress of the polishing treatment. The changing rate in the electric resistance is saturated when the top surface of the plasma SiOx layer 72 becomes flat as shown in FIG. 7D.

Note that, although the CMP method of a conductive layer according to the former embodiment is explained where the embedded wiring is formed of Al alloy, this method may be applied to a case where a contact hole is buried by a conductive layer. Similarly, the CMP method of a non-conductive layer may be applied to a structure, such as an embedded device-separation utilizing $SiO_2$ and the like or a trench capacitor utilizing poly-crystalline Si and the like, other than the above described inter-level insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A chemical mechanical polishing apparatus comprising:

a polishing mechanism for subjecting a target surface of a target object to a polishing treatment, by moving said target surface and a polishing surface of a polishing member relative to each other while supplying a polishing liquid between said target surface and said polishing surface;

a measuring mechanism for measuring an electric property comprising electric resistance or a property representing said resistance between a pair of measuring points on said target surface, while subjecting said target surface to said polishing treatment;

a controller for causing said polishing treatment to be ended by comparing detected values derived from measured values of said electric property with a reference value set to correspond to an end point of said polishing treatment; and wherein said controller processes said reference values and said detected values as values of a changing rate in said electric resistance.

2. The apparatus according to claim 1, wherein said measuring mechanism comprises a pair of electrodes arranged on opposite sides of said target surface to define said pair of measuring points.

3. The apparatus according to claim 1, wherein said pair of measuring points are rotated integratedly with said target object during said polishing treatment.

4. The apparatus according to claim 1, wherein said target surface is defined by a non-conductive layer, and said measuring mechanism is arranged such that said electric property comprises electric resistance or a property representing said resistance of a liquid layer, which is formed of said polishing liquid between said target surface and said polishing surface.

5. A chemical mechanical polishing method comprising the steps of:

subjecting a target surface of a target object to a polishing treatment, by moving said target surface and a polishing surface of a polishing member relative to each other while supplying a polishing liquid between said target surface and said polishing surface;

measuring an electric property comprising electric resistance or a property representing said resistance between a pair of measuring points on said target surface, while subjecting said target surface to said polishing treatment;

causing said polishing treatment to be ended by comparing detected values derived from measured values of said electric property with a reference value set to correspond to an end point of said polishing treatment; and wherein said reference value and said detected values comprise values of a changing rate in said electric resistance.

6. The method according to claim 5, wherein said pair of measuring points are arranged on opposite sides of said target surface.

7. The method according to claim 5, wherein said pair of measuring points are rotated integratedly with said target object during said polishing treatment.

8. The method according to claim 5, wherein said target surface is defined by a non-conductive layer, and said electric property comprises electric resistance or a property representing said resistance of a liquid layer, which is formed of said polishing liquid between said target surface and said polishing surface.

9. A chemical mechanical polishing apparatus comprising:

a polishing mechanism for subjecting a target surface of a target object to a polishing treatment, by moving said target surface and a polishing surface of a polishing member relative to each other while supplying a polishing liquid between said target surface and said polishing surface;

a measuring mechanism for measuring an electric property comprising electric resistance or a property representing said resistance between a pair of measuring points on said target surface, while subjecting said target surface to said polishing treatment;

a controller for causing said polishing treatment to be ended by comparing detected values derived from measured values of said electric property with a reference value set to correspond to an end point of said polishing treatment;

wherein said target object comprises a semiconductor wafer, and said polishing mechanism includes a holder for holding said wafer;

wherein said target object includes a conductive layer defining said target surface, and an insulating layer arranged under said conductive layer and having a groove buried by part of said conductive layer, and said polishing treatment is performed by said polishing mechanism until said groove is exposed on said target surface at said end point;

wherein said groove of said insulating layer corresponds to a first dicing line extending across said wafer for cutting away a plurality of semiconductor devices to be formed on said wafer, from each other, and said first pair of measuring points are arranged on opposite ends of said dicing line; and wherein said target object includes a second dicing line substantially equivalent to and perpendicular to said first dicing line, said measuring mechanism including a second pair of measuring points equivalent to said first pair of measuring points and arranged on opposite ends of said second dicing line, and said controller derives said detected values from measured values obtained by said first and second two pairs of measuring points.

10. A chemical mechanical polishing method comprising the steps of:

subjecting a target surface of a target object to a polishing treatment, by moving said target surface and a polishing surface of a polishing member relative to each other while supplying a polishing liquid between said target surface and said polishing surface;

measuring an electric property comprising electric resistance or a property representing said resistance between a pair of measuring points on said target surface, while subjecting said target surface to said polishing treatment;

causing said polishing treatment to be ended by comparing detected values derived from measured values of said electric property with a reference value set to correspond to an end point of said polishing treatment;

wherein said target object comprises a semiconductor wafer; and wherein said target object includes a conductive layer defining said target surface, and an insulating layer arranged under said conductive layer and having a groove buried by part of said conductive layer, and said groove is exposed on said target surface at said end point.

11. The apparatus according to claim 9, wherein said controller processes said reference value and said detected values as values of said electric resistance.

12. The apparatus according to claim 9, wherein said controller processes said reference value and said detected values as values of a changing rate in said electric resistance.

13. The apparatus according to claim 9, wherein said measuring mechanism comprises a pair of electrodes arranged on opposite sides of said target surface to define each pair of measuring points.

14. The apparatus according to claim 9, wherein said pairs of measuring points are rotated integratedly with said target object during said polishing treatment.

15. The method according to claim 10, wherein said reference value and said detected values comprise values of said electric resistance.

16. The method according to claim 10, wherein said reference value and said detected values comprises values of a changing rate in said electric resistance.

17. The method according to claim 10, wherein said pair of measuring points are arranged on opposite sides of said target surface.

18. The method according to claim 10, wherein said pair of measuring points are rotated integratedly with said target object during said polishing treatment.

19. The method according to claim 10, wherein said groove of said insulating layer corresponds to a dicing line extending across said wafer for cutting away plurality of semiconductor devices to be formed on wafer, from each other, and said pair of measuring points are arranged on opposite ends of said dicing line.

20. The method according to claim 10, wherein target object includes a second dicing line substantially equivalent to and perpendicular to said dicing line, another pair of measuring points equivalent to said pair of measuring points are arranged on opposite ends of said second dicing line and said detected values are derived from measuring values obtained by said two pairs of measuring points.

* * * * *

UNITED STATES PATENT AND TRADEMARK OFFICE
CERTIFICATE OF CORRECTION

PATENT NO. : 6,015,754
DATED : January 18, 2000
INVENTOR(S) : Yasukazu Mase et al.

It is certified that error appears in the above-identified patent and that said Letters Patent is hereby corrected as shown below:

Claim 1, column 10,
Line 9, "reference values" should read -- reference value --.

Signed and Sealed this

Eighteenth Day of September, 2001

Attest:

NICHOLAS P. GODICI
Attesting Officer    Acting Director of the United States Patent and Trademark Office